United States Patent [19]
Yokoyama

[11] Patent Number: 5,598,013
[45] Date of Patent: Jan. 28, 1997

[54] SEMICONDUCTOR DEVICE HAVING A SOURCE-DRAIN REGION OF A LOAD TRANSISTOR THAT IS FORMED BY IMPLANTING AN IMPURITY USING AN INSULATION LAYER AS A MASK

[75] Inventor: Hiroaki Yokoyama, Tokyo, Japan

[73] Assignee: NEC Corporation, Tokyo, Japan

[21] Appl. No.: 353,319

[22] Filed: Dec. 5, 1994

[30] Foreign Application Priority Data

Dec. 3, 1993 [JP] Japan ................................ 5-303719

[51] Int. Cl.$^6$ ........................................... H01L 27/11
[52] U.S. Cl. ........................ 257/67; 257/903; 257/69; 257/66
[58] Field of Search .................. 257/67, 66, 69, 257/903

[56] References Cited

U.S. PATENT DOCUMENTS 5,350,933  9/1994  Yoshihara ........................ 257/903
5,352,916  10/1994  Kiyono et al. ..................... 257/903
5,373,170  12/1994  Pfiester et al. ...................... 257/68
5,404,030  4/1995  Kim et al. ........................ 257/903

FOREIGN PATENT DOCUMENTS 2-295164  12/1990  Japan.

*Primary Examiner*—Sara W. Crane
*Assistant Examiner*—Alexander Oscar Williams
*Attorney, Agent, or Firm*—Foley & Lardner

[57] ABSTRACT

A semiconductor device according to the invention includes a first conductivity type of driver transistor, a second conductivity type of load transistor formed on the driver transistor and an insulation layer formed between the driver transistor and the load transistor. The insulation layer is provided thereon with a depression area in which a channel region, a gate insulation layer and a gate electrode of the load transistor are formed.

15 Claims, 12 Drawing Sheets

SEMICONDUCTOR DEVICE HAVING A SOURCE-DRAIN REGION OF A LOAD TRANSISTOR THAT IS FORMED BY IMPLANTING AN IMPURITY USING AN INSULATION LAYER AS A MASK

FIELD OF THE INVENTION

The invention relates to a semiconductor device, especially to bottom-gate type of TFT (Thin Film Transistor) used as an active element for an LCD (Liquid Crystal Display) and a load element of an SRAM (Static Random Access Memory).

BACKGROUND OF THE INVENTION

Recently, in response to improvement of capacity expansion of memories, TFT types of load transistors have been used in SRAMs instead of high resistance types of load element, which are conventional. In a high resistance type of load system, a gate electrode, a resistance line layer and a high resistance layer are respectively formed on first, second and third layers. On the other hand, in a TFT type of load system, first and second layers are fabricated in the same manner as the high resistance type of load system, however, a TFT gate electrode and a TFT substrate region are formed on third and fourth layers, respectively.

In a conventional SRAM (Static Random Access Memory) with bottom-gate TFT load transistor described in a publication, Japanese Patent Kokai Heisei 2-295164, a pair of PMOS load transistors are formed on a pair of NMOS driver transistors and a pair of NMOS transmission transistors.

In each PMOS load transistor, a high concentration P-type impurity region to be a source-drain region is formed by photolithography technique using a photo resist. In the photolithography processing, misalignment may be happened, for example, overlapped area of a gate electrode of the transistor and the high concentration P-type impurity region varies and thereby effective channel length varies as well. By the misalignment, the pair of the PMOS load transistors are unbalanced in characteristic, so that the transistors have the different standby current values. According to the conventional memory cell, it is difficult to enlarge an area of channel regions. That is, if the channel regions are formed to be large, the memory cell itself should be large as well, which is a big problem in miniaturizing of semiconductor device.

SUMMARY OF THE INVENTION

Accordingly an object of the invention is to provide a high quality semiconductor device using a precisely fabricated TFT (Thin Film Transistor).

Another object of the invention is to provide a semiconductor device using a TFT (Thin Film Transistor) in which the channel region can be enlarged easily without enlargement of the semiconductor device itself.

Another object of the invention is to provide a semiconductor memory device having a pair of MOS load transistors which are well balanced in characteristics.

According to the invention, a semiconductor device includes a first conductivity type of driver transistor, a second conductivity type of load transistor formed on the driver transistor and an insulation layer formed between the driver transistor and the load transistor. The insulation layer is provided thereon with a depression area in which a channel region, a gate insulation layer and a gate electrode of the load transistor are formed. The channel region and a source-drain region of the load transistor are formed in a self-alignment fashion by implanting impurity.

DESCRIPTION OF THE PREFERRED EMBODIMENTS

Figure 1:
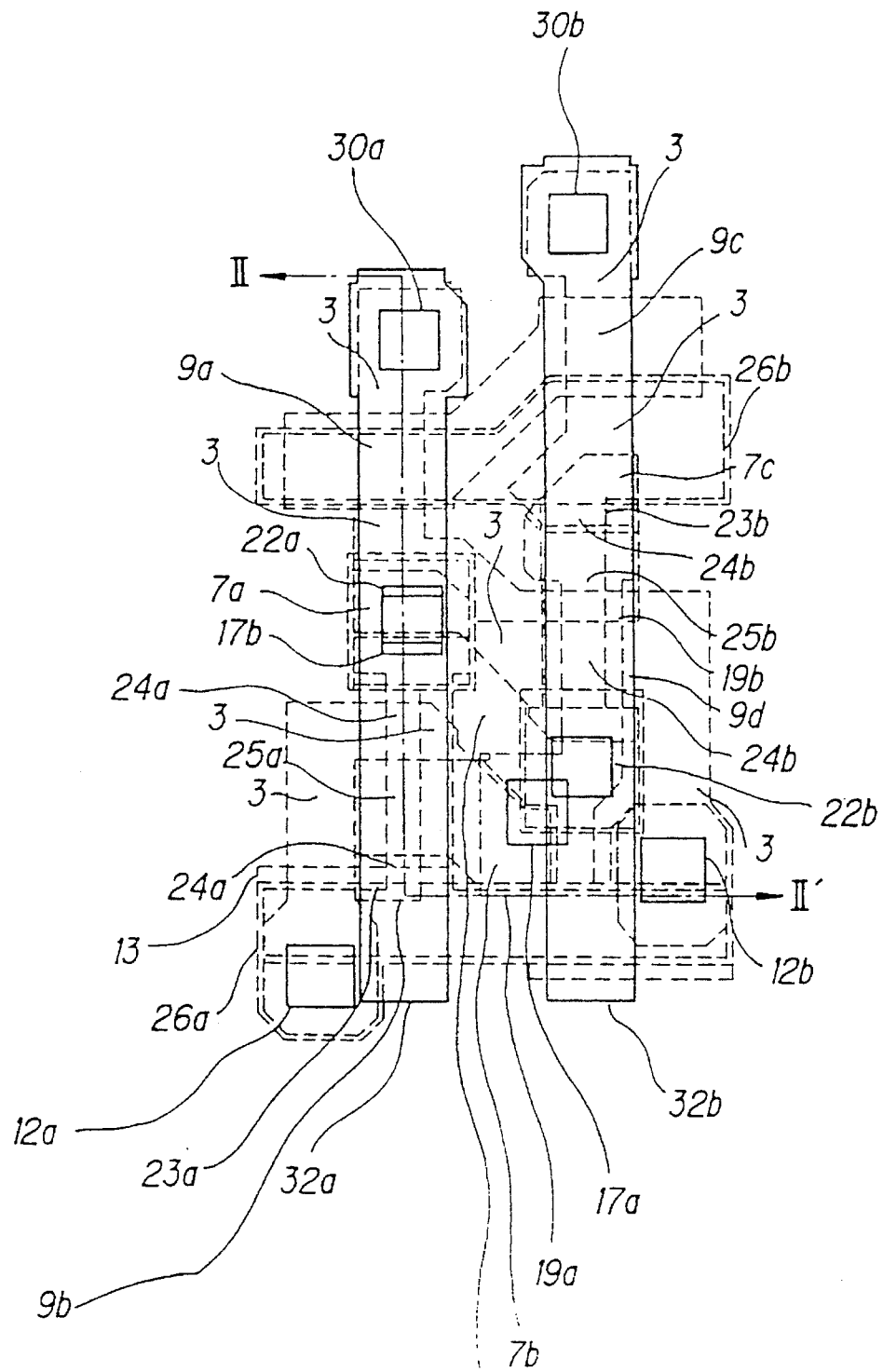
FIG. 1 is a plane view illustrating the structure of a conventional memory device.
Figure 2:
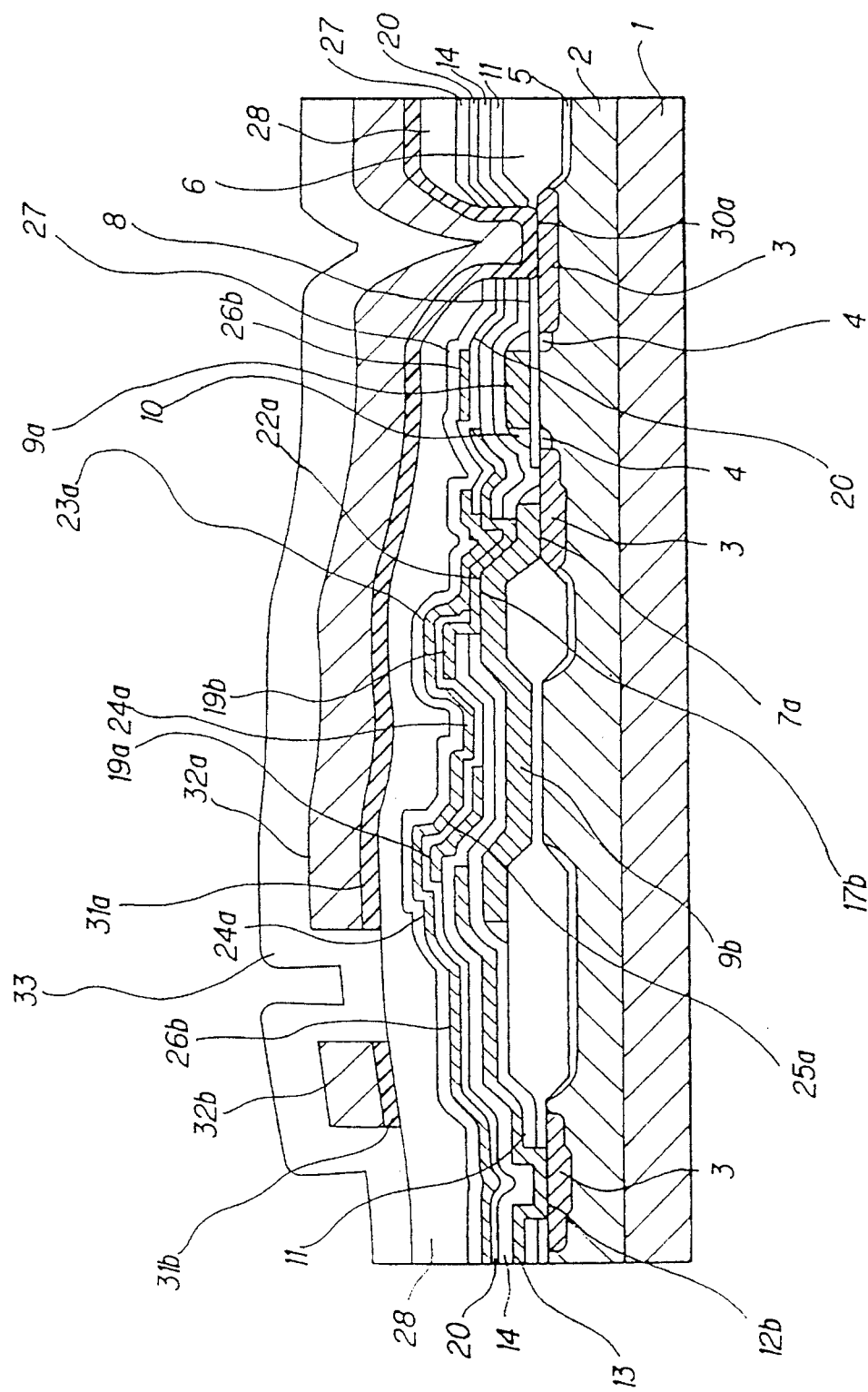
FIG. 2 is a cross-sectional view taken on line II—II in FIG. 1.

For better understanding of the invention, a conventional technology is described first. FIGS. 1 and 2 show a conventional TFT (Thin Film Transistor) load SRAM, which is of bottom-gate type. FIG. 2 is a cross-sectional view taken on line II—II in FIG. 1. The bottom gate TFT load type of SRAM is fabricated in accordance with the following steps:

(1) A P-type impurity region 5 is formed on a P-type well region 2 formed on a silicon substrate 1, and then an element separation oxide silicon layer 6 is formed thereon to have a thickness of about 500 nm.

(2) The silicon substrate 1 is oxidized by thermal treatment to form an NMOS gate oxide silicon layer 8 having a thickness of 20 nm.

(3) With Photolithography technique, the NMOS gate oxide silicon layer 8 is patterned to form first contract holes 7a, 7b and 7c. Under the first contact holes, a high concentration N-type impurity region 3 is formed by heat diffusion of phosphorus during NMOS gate electrodes being formed.

(4) With CVD (Chemical Vapor Deposition) technique, NMOS gate electrodes 9a, 9b, 9c and 9d are formed to have a thickness of 300 nm on the NMOS gate oxide silicon layer 8. The NMOS gate electrodes 9a, 9b, 9c and 9d have polycide structure, which is formed by the steps of heat-diffusing phosphorus onto polycrystal silicon, and then sputtering a compound (silicide) of high melting point metal, such as Ti (Titanium) or W (Tungsten) and silicon.

(5) With Photolithography technique, the NMOS gate electrodes 9a, 9b, 9c and 9d are patterned, and impurity (phosphorus) is implanted therein by ion implantation technique to form a low concentration N-type impurity region 4.

(6) With CVD technique, a first oxide silicon layer 10 is formed to have a thickness of about 100 nm on the element separation oxide silicon layer 6, low concentration N-type impurity region 4 and NMOS gate electrodes 9a, 9b, 9c and 9d.

(7) With Etching technique, the first oxide silicon layer 10 is etched-back and with ion implantation technique, impurity (arsenic) is implanted thereinto with a mask of the NMOS gate electrodes 9a, 9b, 9c and 9d and first oxide silicon layer 10 to form a high concentration N-type impurity region 3.

(8) With CVD technique, a second oxide silicon layer 11 is formed to have a thickness of about 100 nm.

(9) With Photolithography technique, second contact holes 12a and 12b are formed through the second oxide silicon layer 11.

(10) With CVD technique, a ground voltage line 13 is formed to have a thickness of about 100 nm, the line 13 being formed with compound (silicide) of high melting point metal, such as Ti or W (Tungsten) and silicon.

(11) With Photolithography technique, the ground voltage line 13 is patterned to be a predetermined shape.

(12) With CVD technique, a third oxide silicon layer 14 is formed to have a thickness of about 100 nm.

(13) With Photolithography technique, third contact holes 17a and 17b are formed through the second and third oxide silicon layers 11 and 14.

(14) With CVD technique, a polycrystal layer, which will be gate electrodes 19a and 19b of PMOS load transistor, is formed to have a thickness of about 100 nm.

(15) With Ion-Implantation technique, impurity (phosphorus) is implanted and with photolithography technique, the gate electrodes 19a and 19b of a PMOS load transistor are patterned to be predetermined shapes.

(16) With CVD technique, an oxide silicon gate layer 20 of the PMOS load transistor is formed to have a thickness of about 30 nm.

(17) With Photolithography technique, fourth contact holes 22a and 22b are formed through the oxide silicon gate layer 20 of the PMOS load transistor.

(18) With CVD technique, substrate regions 23a and 23b of the PMOS load transistor and Vcc voltage line 26a and 26b are formed to have a thickness of about 50 nm, those being formed with amorphous silicon film.

(19) Impurity (phosphorus) is implanted into the substrate regions 23a and 23b and voltage lines 26a and 26b, and then being patterned with photolithography technique.

Figure 3:
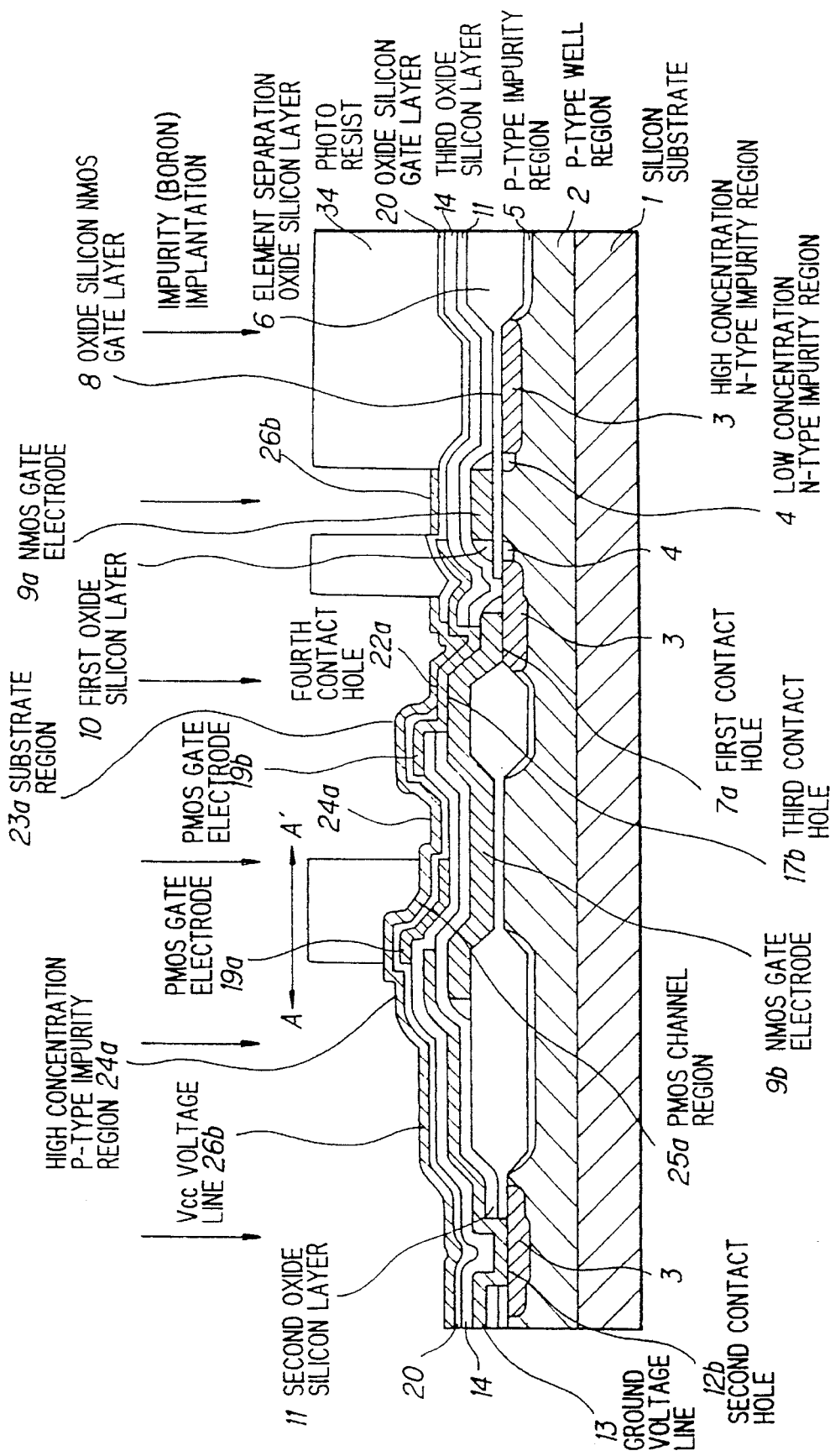
FIG. 3 is a cross-sectional view illustrating a fabrication step of the conventional memory device shown in FIGS. 1 and 2.

(20) As shown in FIG. 3, impurity (boron) is implanted with photolithography technique into high concentration P-type impurity regions 24a and 24b of the PMOS load transistor and also into the voltage lines 26a and 26b.

(21) With CVD technique, fifth and sixth oxide silicon layers 27 and 28 are formed to have thicknesses of about 100 nm and 300 nm, respectively, and they are heated.

(22) With Photolithography technique, fifth contact holes 30a and 30b are formed through the oxide silicon gate layer 8 of a driver NMOS transistor, second oxide silicon layer 11, third oxide silicon layer 14, oxide silicon gate layer 20 of the PMOS load transistor, fifth oxide silicon layer 27 and sixth oxide silicon layer 28.

(23) Barrier metal layers 31a and 31b and aluminum lines 32a and 32b are formed on thus fabricated layers, and passivation layer 33 is entirely formed thereon.

In FIGS. 1 and 2, each of 25a and 25b represents a PMOS channel region.

Figure 4:
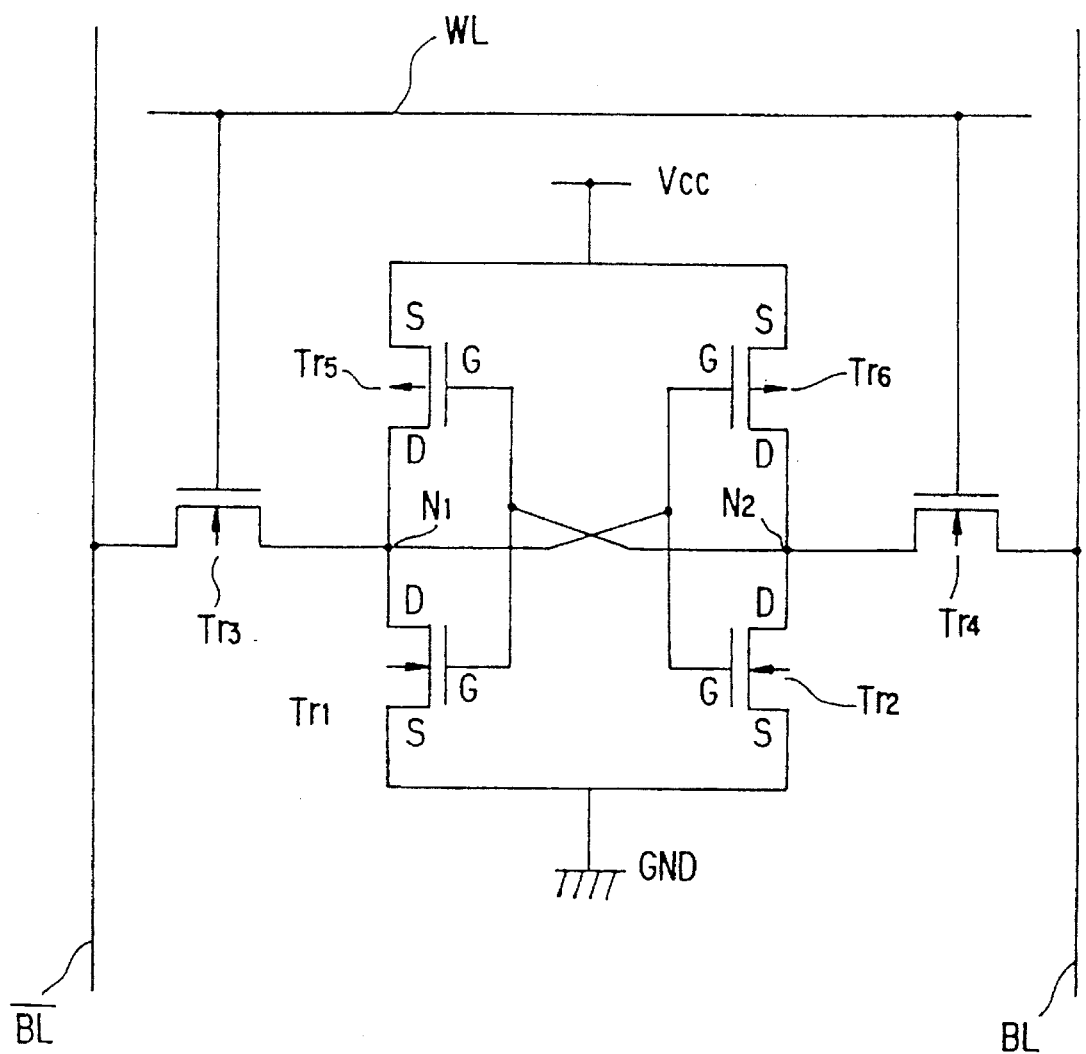
FIG. 4 is a circuit diagram illustrating a memory cell to which the invention is applied.

FIG. 4 shows a circuit for a memory cell of bottom gate TFT load type of SRAM, which is composed of two of the devices shown in FIGS. 1 and 2. In FIG. 4, pairs of Tr1 and Tr2, Tr5 and Tr6 and Tr3 and Tr4 respectively represent first and second NMOS driver transistors, first and second PMOS load transistors, and first and second NMOS transmission transistors for read/write of data. Symbols WL, BL and BL, Vcc and GND respectively represent a gate electrode of first and second NMOS transmission transistors, a pair of bit lines, a voltage of a Vcc voltage line and the ground voltage.

The gate G of the first NMOS driver transistor Tr1 (or second NMOS driver transistor Tr2), gate G of the first PMOS load transistor Tr5 (or second PMOS load transistor Tr6) and gate electrode WL of the first NMOS transmission transistor Tr3 (or second NMOS transmission transistor) respectively correspond to the NMOS gate electrode 9b (or 9d), PMOS gate electrode 19b (or 19a) and NMOS gate electrode 9c (or 9a).

Operation of the memory cell is now explained. It is assumed that an L level signal is supplied from the bit line BL (inverse) through the first NMOS transmission transistor Tr3 to the connecting point N1 of drains Ds of the first PMOS load transistor Tr5 and the first NMOS driver transistor Tr1, and a H level signal is supplied from the bit line BL through the second NMOS transmission transistor Tr4 to the connecting point N2 of drains Ds of the second PMOS load transistor Tr6 and second NMOS driver transistor Tr2.

In this situation, an H level signal is supplied to each gate G of the first NMOS driver transistor Tr1 and first PMOS load transistor Tr5, so that the first NMOS driver transistor Tr1 and first PMOS load transistor Tr5 are turned ON and OFF, respectively, and the connection point N1 keep L with connecting to the ground GND. An L level signal is supplied to each gate G of the second NMOS driver transistor Tr2 and second PMOS load transistor Tr6, so that the second NMOS driver transistor Tr2 and second PMOS load transistor Tr6 are turned OFF and ON, respectively. A connecting point N2 maintains H level because the connecting point is connected through the second PMOS load transistor being ON to the direct current voltage Vcc. In this case, the amount of standby current flowing through the memory cell depends on the amount of leak current of the transistors Tr2 and Tr5, which are turned off. Because the second NMOS driver transistor Tr2 is a bulk transistor through which little amount of leak current is flowing, the amount of standby current depends on the amount of leak current flowing through the first PMOS transistor Tr5.

As shown in FIG. 3, the high concentration P-type impurity region 24a, which will be a source-drain region of a PMOS load transistor, is formed with photolithography technique using a photo resist 34 covering the area other than the high concentration P-type impurity region 24a and Vcc voltage lines 26a and 26b. In the photolithography processing, misalignment may be happened. For example, misalignment is happened at A—A portion in FIG. 3, overlapped area of the gate electrode 19a of the PMOS load transistor and the high concentration P-type impurity region 24a varies and thereby effective channel length varies. As described before, by the misalignment, the PMOS load transistors Tr5 and Tr6 are unbalanced in characteristic, so that the standby current varies as well. When the PMOS load transistors Tr5 and Tr6 have different values of OFF current from each other, the standby current is different between two cases of that the PMOS load transistor Tr5 is turned off (the connecting point N1 is at L level) and of that the PMOS load transistor Tr6 is turned off (the connecting point N2 is at L level).

If one of the two PMOS load transistors has very small amount of OFF current and the other has very large amount of OFF current, more electric power is consumed in the case that the other PMOS load transistor is turned off in the standby condition of the SRAM. The consumed electric power may be larger than its maximum standard value. Further, by the misalignment in the photolithography processing of the high concentration P-type impurity region 24a, the transistors have different values of ON current in addition to different values of OFF current.

Because the first and second PMOS load transistors Tr5 and Tr6 are formed on the first and second NMOS driver transistors Tr1 and Tr2 and the first and second NMOS transmission transistors Tr3 and Tr4, it is difficult to enlarge an area of the channel regions 25a and 25b. That is, as described before, if the channel regions 25a and 25b are formed to be large, the memory cell itself becomes large too.

Figure 5:
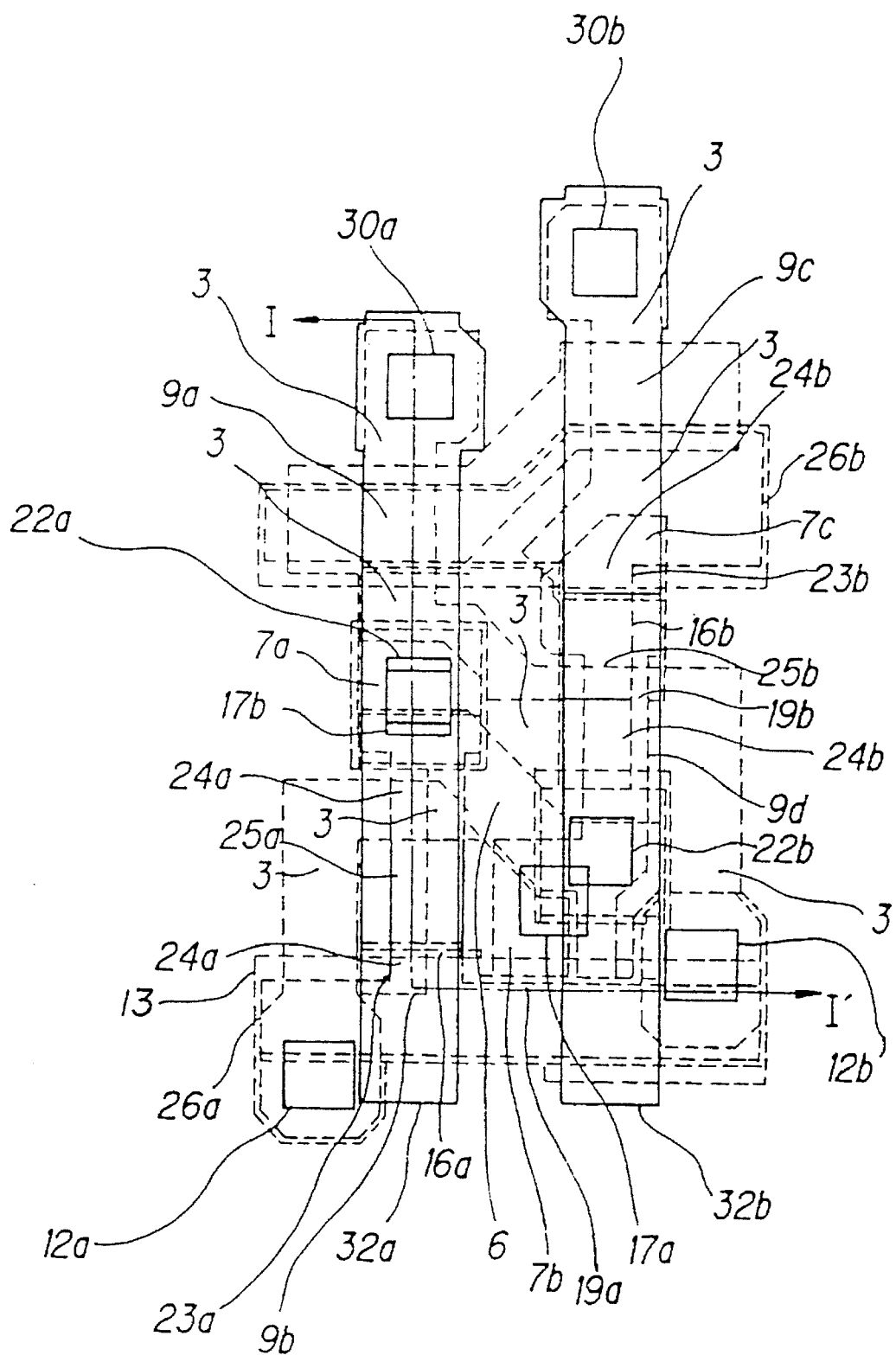
FIG. 5 is a plane view illustrating the structure of a memory device of a first preferred embodiment according to the invention.
Figure 6:
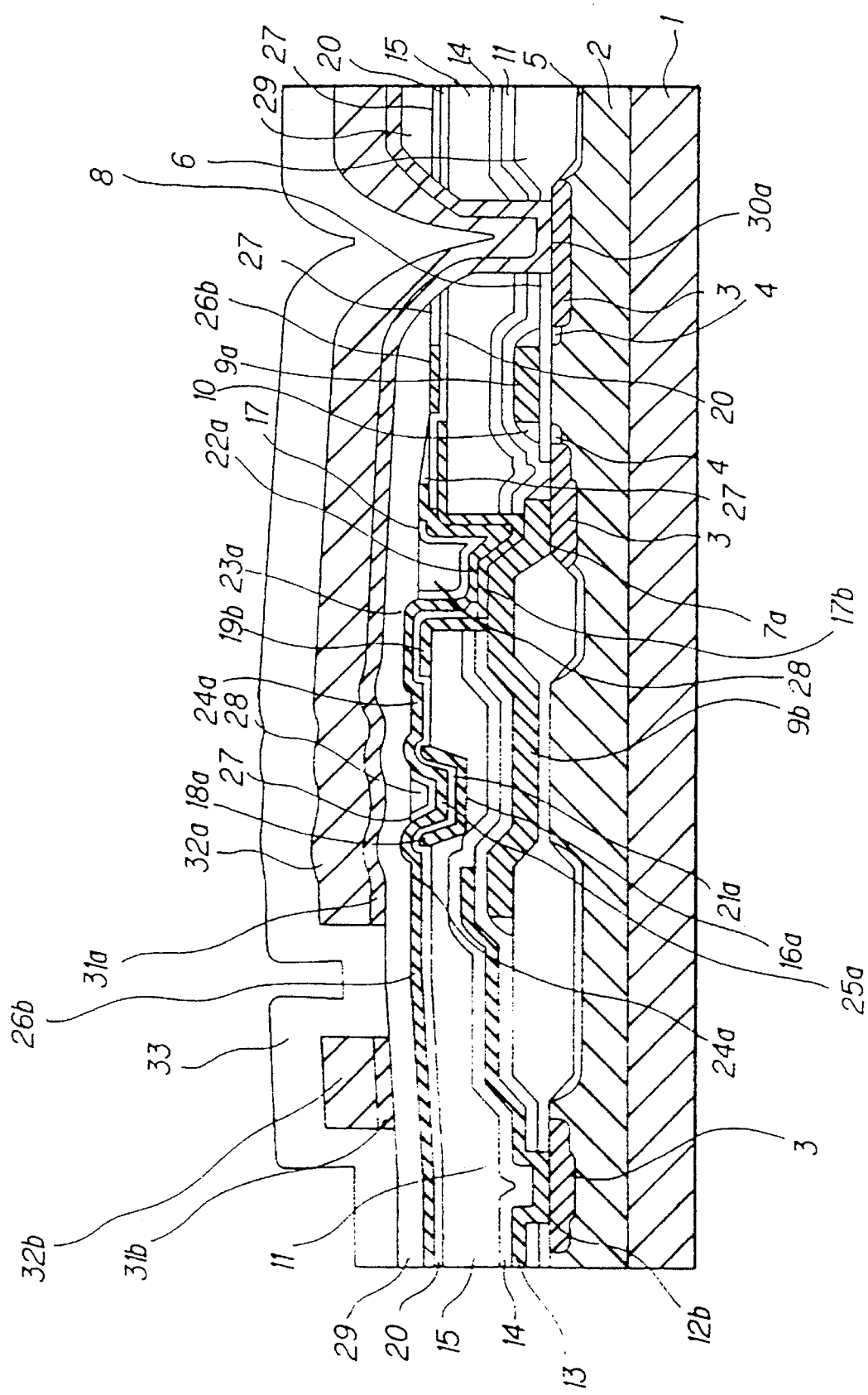
FIG. 6 is a cross-sectional view taken on line 8—8 in FIG. 5.

Preferred embodiments of the invention are now described in accordance with drawings FIGS. 4 to 12. FIGS. 5 and 6 show a bottom-gate type of TFT load SRAM according to a first preferred embodiment. The SRAM shown in FIGS. 5 to 12 has the same components as the above mentioned conventional memory cell, shown in FIGS. 1 to 3, so that the common reference numbers are used for the corresponding components.

Figure 7:
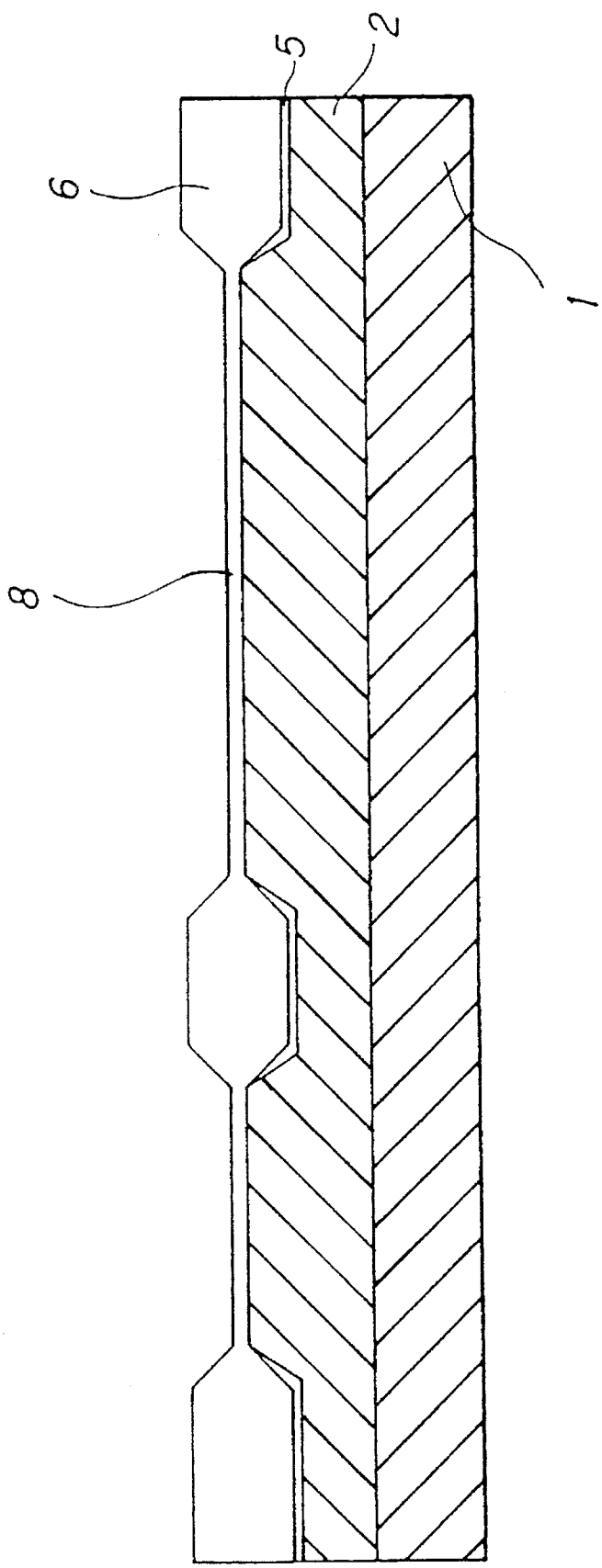
FIGS. 7 to 12 are cross-sectional views illustrating fabrication steps of the memory device shown in FIGS. 5 and 6.

FIGS. 7 to 12 show intermediate steps of fabrication of the TFT load SRAM of the first preferred embodiment. The TFT load SRAM is fabricated as follows:

(1) As shown in FIG. 7, a P-type impurity region 5 is formed on a P-type well region 2 on a silicon substrate 1, and then an element separation oxide silicon layer 6 is formed thereon to have a thickness of about 500 nm.

(2) The silicon substrate 1 is oxidized by heat treatment to form an NMOS gate oxide silicon layer 8 having a thickness of 20 nm.

Figure 8:
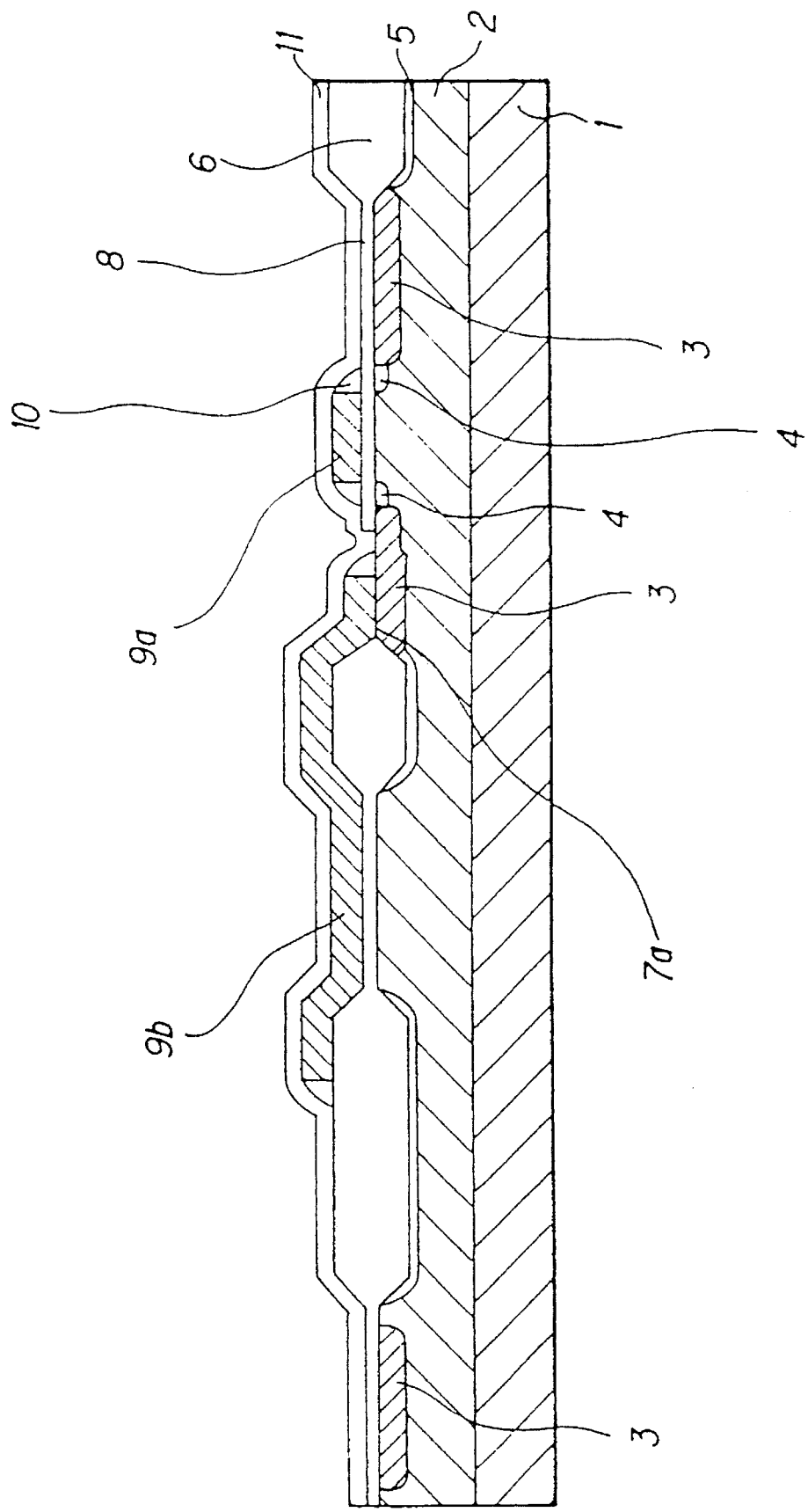

(3) As shown in FIG. 8, the NMOS gate oxide silicon layer 8 is patterned with Photolithography technique to form first contract holes 7a, 7b and 7c. Under the first contact holes, a high concentration N-type impurity region 3 will be formed by heat diffusion of phosphorus during NMOS gate electrodes being formed.

(4) With CVD (Chemical Vapor Deposition) technique, NMOS gate electrodes 9a, 9b, 9c and 9d are formed to have a thickness of 300 nm on the NMOS gate oxide silicon layer 8. The NMOS gate electrodes 9a, 9b, 9c and 9d have polycide structure in which phosphorus is heat-diffused on polycrystal silicon. Silicide which is compound material of high melting point metal, such as Ti (Titanium) or W (Tungsten), and silicon, is sputtered thereon.

(5) With Photolithography technique, the NMOS gate electrodes 9a, 9b, 9c and 9d are patterned, and impurity (phosphorus) is implanted therein by ion implantation technique to form a low concentration N-type impurity region 4.

(6) With CVD technique, a first oxide silicon layer 10 is formed to have a thickness of about 100 nm on the element separation oxide silicon layer 6, low concentration N-type impurity region 4 and NMOS gate electrodes 9a, 9b, 9c and 9d.

(7) with Etching technique, the first oxide silicon layer 10 is etched-back, and then impurity (arsenic) is implanted thereinto with ion implantation technique using a mask of the NMOS gate electrodes 9a, 9b, 9c and 9d and first oxide silicon layer 10 to form a high concentration N-type impurity region 3.

(8) With CVD technique, a second oxide silicon layer 11 is formed to have a thickness of about 100 nm.

Figure 9:
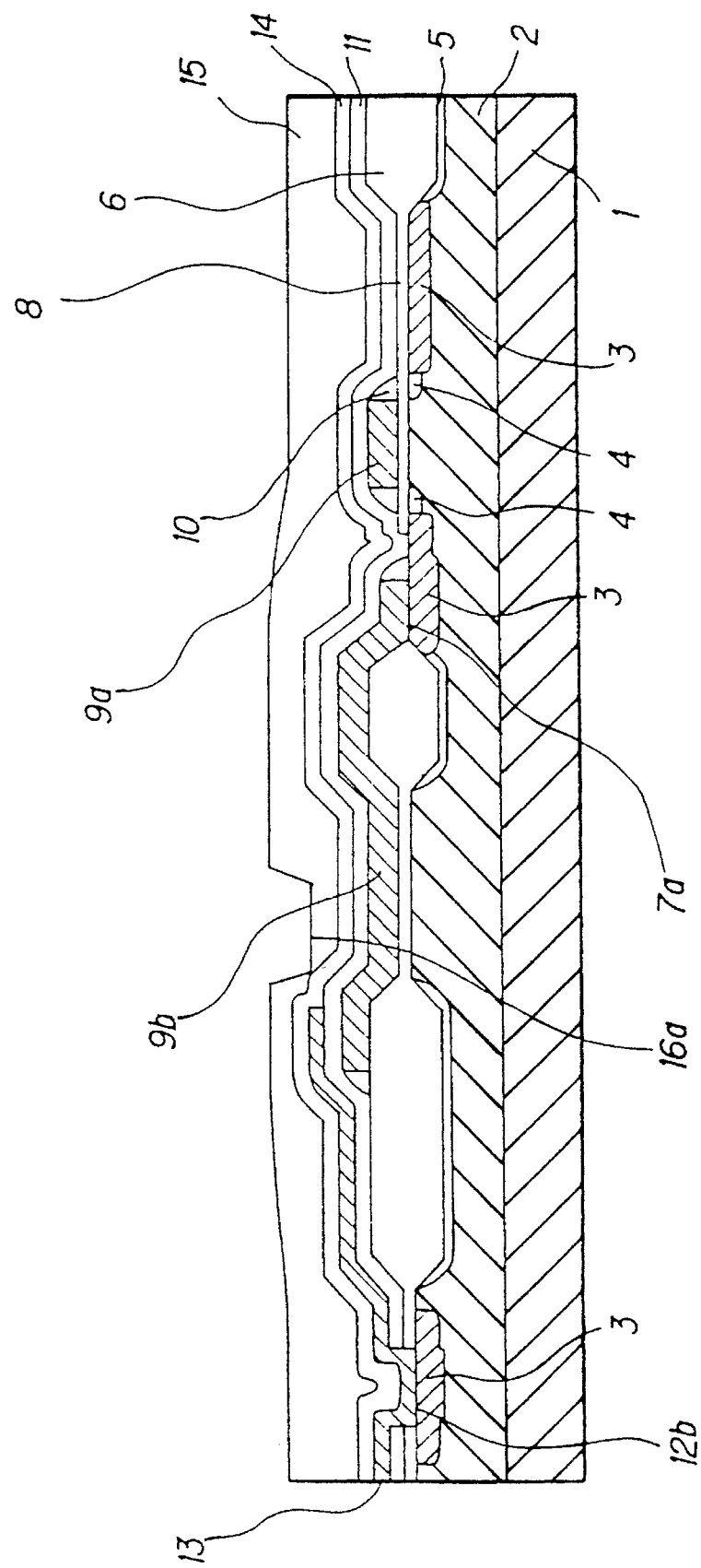
Figure 10:
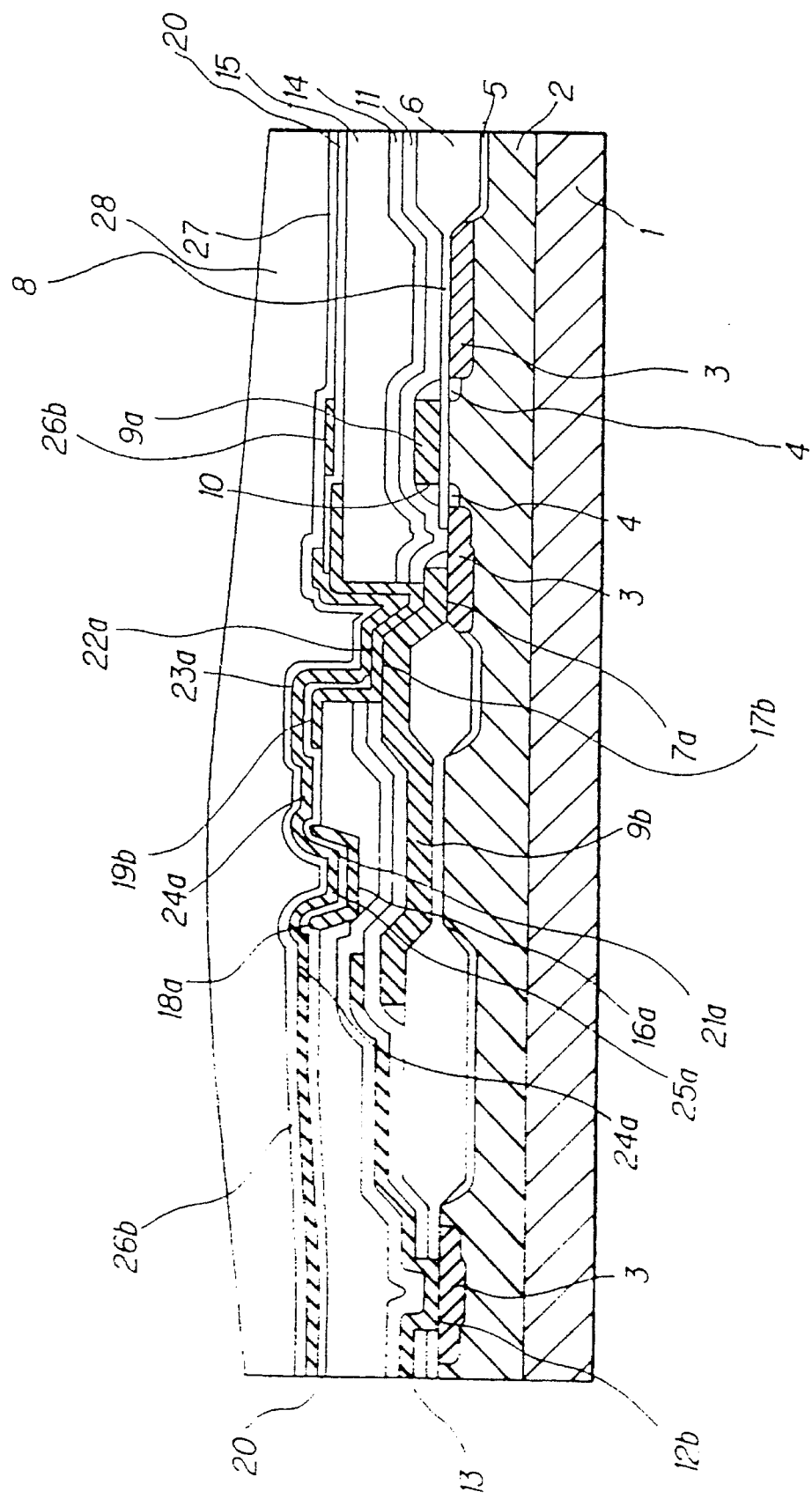

(9) As shown in FIG. 9, second contact holes 12a and 12b are formed through the second oxide silicon layer 11 with Photolithography technique.

(10) With CVD technique, a ground voltage line 13 is formed to have a thickness of about 100 nm, the line 13 being of silicide which is compound material of high melting point metal, such as Ti or W (Tungsten), and silicon.

(11) With Photolithography technique, the ground voltage line 13 is patterned to be a predetermined shape.

(12) With CVD technique, a third oxide silicon layer 14 is formed to have a thickness of about 100 nm.

(13) With CVD technique, a fourth oxide silicon layer 15 is formed on the third oxide silicon layer 14 to have a thickness of about 300 nm, and then the layer is heated. The fourth oxide silicon layer 15 is etched to have forward tapered grooves 16a and 16b thereon.

(14) With Photolithography technique, third contact holes 17a and 17b are formed through the second, third and fourth oxide silicon layers 11, 14 and 15.

(15) With CVD technique, a polycrystal layer, which will be gate electrodes 19a and 19b of the PMOS load transistor, is formed to have a thickness of about 100 nm.

(16) With Ion-Implantation technique, impurity (phosphorus) is implanted, and then the gate electrodes 19a and 19b of the PMOS load transistor are patterned with photolithography technique to be predetermined shapes. Gate electrodes 18a and 18b, facing channel regions 25a and 25b of the PMOS load transistors, are formed within the grooves 16a and 16b.

(17) With CVD technique, an oxide silicon gate layer 20 of the PMOS load transistor is formed to have a thickness of about 30 nm. Gate oxide silicon layers 21a and 21b, facing channel regions 25a and 25b of the PMOS load transistors, are formed within the grooves 16a and 16b.

(18) With Photolithography technique, fourth contact holes 22a and 22b are formed through the oxide silicon gate layer 20 of the PMOS load transistor.

(19) With CVD technique, substrate regions 23a and 23b of the PMOS load transistor and Vcc voltage line 26a and 26b are formed to have a thickness of about 50 nm, those being of amorphous silicon film.

(20) Impurity (phosphorus) is implanted into the substrate regions 23a and 23b and voltage lines 26a and 26b, and then being patterned with photolithography technique.

(21) With CVD technique, fifth and sixth oxide silicon layers 27 and 28 are formed to have thicknesses of about 100 nm and 300 nm, respectively, and they are heated.

Figure 11:
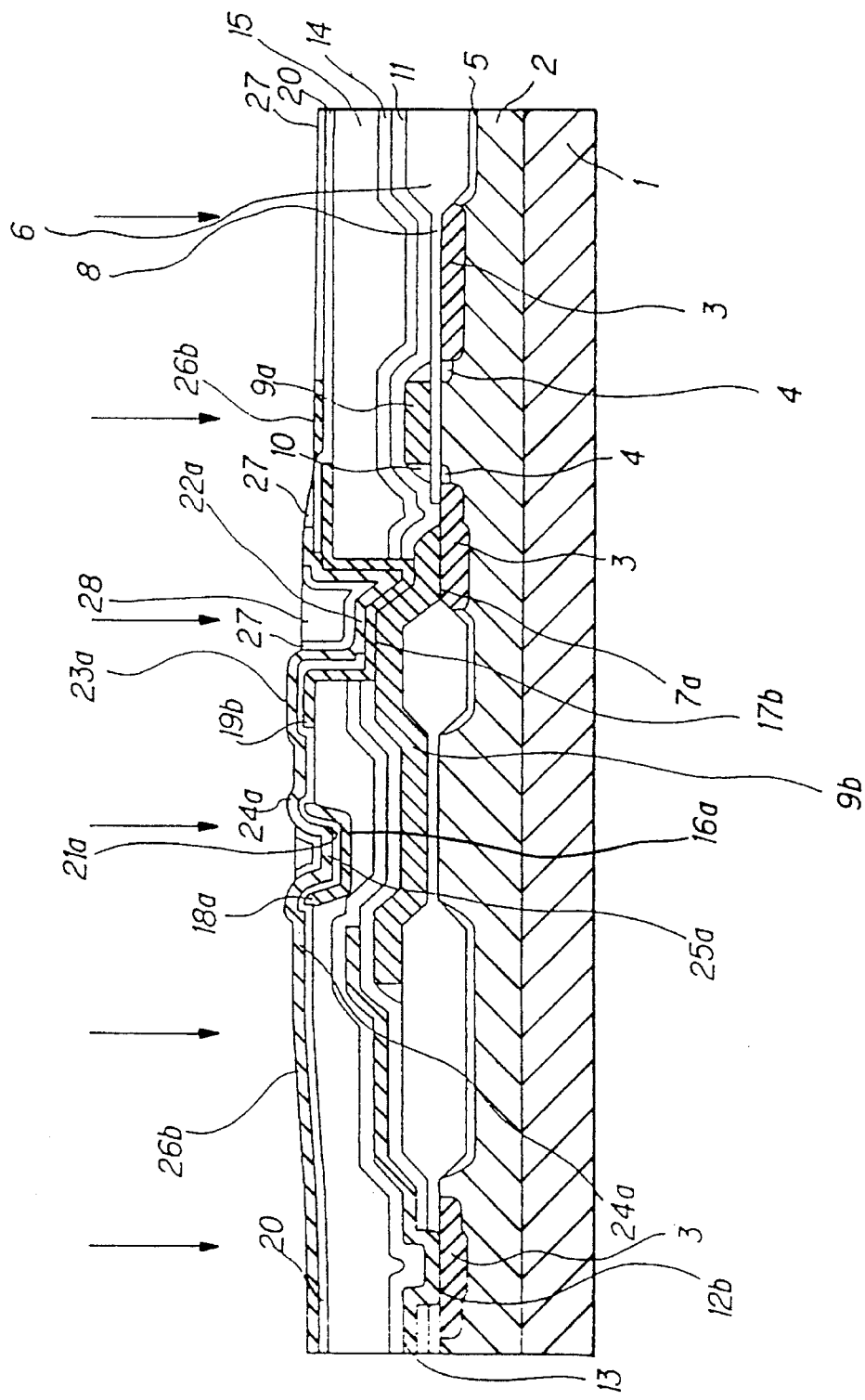

(22) The fifth and sixth oxide silicon layers 27 and 28 are etched as shown in FIG. 11, and then impurity (boron) is implanted with ion implantation technique into the high concentration P-type impurity regions 24a and 24b and into the Vcc voltage lines 26a and 26b. The impurity (boron) is implanted with a mask of the fifth and sixth oxide silicon layers 27 and 28 filled in the grooves, so that the channel regions 25a and 25b and the high concentration P-type impurity regions 24a and 24b for source-drain region of the PMOS load transistor are formed in a self-alignment fashion.

Figure 12:
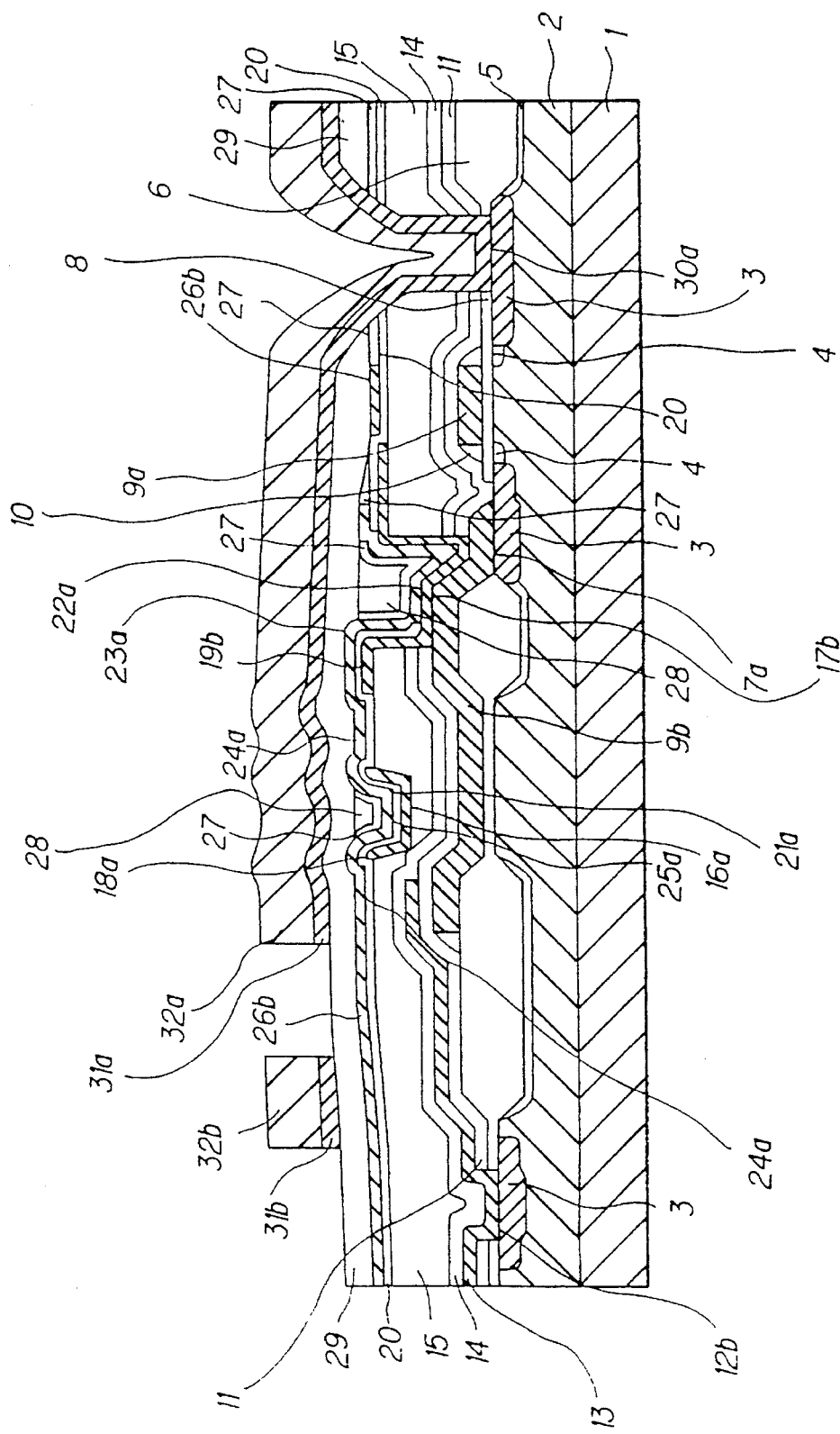

(23) As shown in FIG. 12, a seventh oxide silicon layer 29 is formed with CVD technique to have a thickness of 300 nm.

(24) With Photolithography technique, fifth contact holes 30a and 30b are formed through the oxide silicon gate layer 8 of the driver NMOS transistor, second oxide silicon layer 11, third oxide silicon layer 14, oxide silicon gate layer 20 of the PMOS load transistor, fifth oxide silicon layer 27 and sixth oxide silicon layer 28.

(25) Barrier metal layers 31a and 31b and aluminum lines 32a and 32b are formed on thus fabricated layers.

(26) A passivation layer 33 is entirely formed on thus fabricated product.

Now, referring FIG. 4 again, a memory cell of bottom gate TFT load type of SRAM is composed of two same devices shown in FIGS. 5 and 6.

In a second preferred embodiment of the invention, a ground voltage line (13) is formed with a fourth conductive layer, not with a second conductive layer in the first preferred embodiment. In the second preferred embodiment, gate electrodes (19a and 19b) of a PMOS load transistor are formed with a second conductive layer and substrate regions (23a and 23b) of the PMOS load transistor and a Vcc voltage lines (26a and 26b) are formed with a third conductive layer. In fabrication of the second preferred embodiment, a mask not covering an overlapped portion of the Vcc voltage line 26 and second contact holes 12a and 12b shown in FIG. 2 is used, but the other steps are performed in the same manner as those in the first preferred embodiment.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor device, comprising:

a first conductivity type of driver transistor;

a second conductivity type of load transistor formed on the driver transistor; and an insulation layer formed between the driver transistor and the load transistor;

wherein the insulation layer is provided thereon with a depression area in which a channel region, a gate insulation layer and a gate electrode of the load transistor are formed; and wherein the load transistor is a bottom-gate type, in which the gate electrode of the load transistor is provided under the channel region.

2. The semiconductor device according to claim 1, wherein:

said depression area is a groove.

3. The semiconductor device according to claim 2, wherein:

said groove is formed to be forward tapered shape, the bottom being narrower than the upper opening.

4. The semiconductor device according to claim 1, wherein:

said first and second conductivity types are N-type and P-type, respectively.

5. The semiconductor device according to claim 1, wherein:

said channel region and a source-drain region of the load transistor are formed in a self-alignment fashion by implanting impurity.

6. The semiconductor device according to claim 5, wherein:

said impurity is boron.

7. A semiconductor memory, comprising:

a pair of N-type driver transistors;

a pair of P-type load transistors formed on the driver transistors; and an insulation layer formed between the driver transistors and the load transistors;

wherein the insulation layer is provided thereon with a groove in which channel regions, gate insulation layers and gate electrodes of the load transistors are formed, and wherein the load transistors are each a bottom-gate type, in which the gate electrodes of the load transistors are provided under said channel regions.

8. The semiconductor memory according to claim 7, wherein:

said channel regions and source-drain regions of the load transistors are formed in a self-alignment fashion by implanting impurity.

9. A semiconductor device comprising:

a first conductivity type of driver transistor;

a second conductivity type of load transistor;

a first insulation layer formed between said driver transistor and said load transistor;

a grooved formed on said first insulation layer;

a first contact hole for contacting a gate electrode of said driver transistor and a gate electrode of said load transistor;

a gate insulation layer formed on said gate electrode of said load transistor;

a second contact hole formed on said gate insulation layer;

a substrate region of said load transistor formed on said gate insulation layer;

a channel region of said load transistor formed in said groove; and an insulation layer formed on said substrate region of said load transistor, said insulation layer having a sufficient thickness for filling said channel region of said load transistor formed in said groove;

wherein said insulation layer is located only on said channel region of said load transistor; and wherein a source-drain region of said load transistor is formed in a self-alignment fashion by implanting an impurity and by using said insulation layer as a mask.

10. A semiconductor device, according to claim 9, wherein said gate electrode of said load transistor is provided under said substrate region of said load transistor and said gate insulation layer, and wherein said gate electrode and said channel region of said load transistor are formed in said groove provided in said insulation layer formed on said driver transistor.

11. A semiconductor device, according to claim 9, wherein said load transistor is a thin film PMOS load transistor.

12. A semiconductor device, according to claim 9, wherein said first and second conductivity types are N-type and P-type, respectively.

13. A semiconductor device, according to claim 12, wherein said impurity is boron.

14. A semiconductor device comprising:

a pair of N-type of driver transistors;

a pair of P-type of load transistors formed on the driver transistors;

a first insulation layer formed between said driver transistors and said load transistors;

a grooved formed on said first insulation layer;

a first contact hole for contacting respective gate electrodes of said driver transistors and respective gate electrodes of said load transistors;

a gate insulation layer formed on said gate electrodes of said load transistors;

a second contact hole formed on said gate insulation layer;

a substrate region of said load transistors formed on said gate insulation layer;

a channel region of said load transistors formed in said groove; and an insulation layer formed on said substrate region of said load transistors, said insulation layer having a sufficient thickness for filling said channel region of said load transistors formed in said groove;

wherein said insulation layer is located only on said channel region of said load transistor; and wherein respective source-drain regions of said load transistors are formed in a self-alignment fashion by implanting an impurity and by using said insulation layer as a mask.

15. A semiconductor device, according to claim 14, wherein said impurity is boron.

* * * * *